(12) United States Patent
Mori et al.

(10) Patent No.: US 8,429,594 B2
(45) Date of Patent: Apr. 23, 2013

(54) VIA DESIGN APPARATUS AND VIA DESIGN METHOD BASED ON IMPEDANCE CALCULATIONS

(75) Inventors: Hirofumi Mori, Kawasaki (JP); Jun Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 152 days.

(21) Appl. No.: 12/781,009

(22) Filed: May 17, 2010

(65) Prior Publication Data

US 2010/0251200 A1    Sep. 30, 2010

Related U.S. Application Data

(63) Continuation of application No. PCT/JP2007/072546, filed on Nov. 21, 2007.

(51) Int. Cl.
| G06F 17/50 | (2006.01) |
| G06F 9/455 | (2006.01) |
| G06F 7/60 | (2006.01) |
| G06F 7/62 | (2006.01) |

(52) U.S. Cl.
USPC ............... 716/137; 713/132; 713/136; 703/2; 703/13; 703/14

(58) Field of Classification Search .................. None
See application file for complete search history.

(56) References Cited

U.S. PATENT DOCUMENTS

| 5,966,237 A | 10/1999 | Sugaya et al. |
| 5,995,274 A | 11/1999 | Sugaya et al. |
| 6,025,947 A | 2/2000 | Sugaya et al. |
| 6,144,485 A | 11/2000 | Sugaya et al. |
| 6,157,481 A | 12/2000 | Sugaya et al. |
| 6,198,572 B1 | 3/2001 | Sugaya et al. |
| 6,377,395 B2 | 4/2002 | Sugaya et al. |
| 6,466,348 B1 | 10/2002 | Izumi |
| 6,646,791 B2 | 11/2003 | Sugaya et al. |
| 6,698,000 B2 * | 2/2004 | Tanaka .......................... 716/113 |
| 6,759,257 B2 * | 7/2004 | McCormack et al. .......... 438/15 |
| 6,865,016 B2 | 3/2005 | Sugaya et al. |
| 6,976,233 B1 * | 12/2005 | Frank et al. .................... 716/112 |

(Continued)

FOREIGN PATENT DOCUMENTS

| JP | 6-69660 | 3/1994 |
| JP | 8-123839 | 5/1996 |

(Continued)

OTHER PUBLICATIONS

Shariff et al., Via Interconnections for Wafer Level Packaging: Impact of Tapered Via Shape and Via Geometry on Product Yield and Reliability, 2007 Electronic Components and Technology Conference, pp. 858-863, May 2007.*

(Continued)

Primary Examiner — A. M. Thompson
(74) Attorney, Agent, or Firm — Staas & Halsey LLP

(57) ABSTRACT

A via design apparatus includes a determination section that determines a value of a shape parameter indicating a shape of a via in a multilayer board. The via has a hole passing through the plurality of layers and a conductive section on a side wall of the hole. The apparatus also includes a calculation section that calculates a value of impedance of the via according to the value of the shape parameter.

18 Claims, 10 Drawing Sheets

U.S. PATENT DOCUMENTS

| | | | |
|---|---|---|---|
| 7,224,899 B2 | 5/2007 | Noheji | |
| 7,346,869 B2 * | 3/2008 | Tai et al. | 716/120 |
| 7,409,668 B2 * | 8/2008 | Lin et al. | 716/133 |
| 7,793,241 B2 * | 9/2010 | Tai et al. | 716/115 |
| 7,831,949 B2 * | 11/2010 | Tokunaga et al. | 716/137 |
| 2004/0028407 A1 | 2/2004 | Noheji | |
| 2005/0046927 A1 | 3/2005 | Sugaya et al. | |
| 2005/0230146 A1 * | 10/2005 | Koyama | 174/255 |
| 2007/0245274 A1 * | 10/2007 | Kimura | 716/4 |
| 2007/0300195 A1 * | 12/2007 | Li | 716/5 |
| 2008/0052649 A1 * | 2/2008 | Tai et al. | 716/5 |

FOREIGN PATENT DOCUMENTS

| | | |
|---|---|---|
| JP | 9-325983 | 12/1997 |
| JP | 11-261490 | 9/1999 |
| JP | 2000-101241 | 4/2000 |
| JP | 2000-196169 | 7/2000 |
| JP | 2000-216513 | 8/2000 |
| JP | 2002-334956 | 11/2002 |
| JP | 2004-56245 | 2/2004 |
| JP | 2004-158754 | 6/2004 |

OTHER PUBLICATIONS

International Preliminary Report on Patentability, mailed Jun. 8, 2010, in corresponding PCT Application No. PCT/JP2007/072546 (5 PP.).

Form PCT/ISA/210, mailed Jan. 15, 2008, in corresponding PCT Application No. PCT/JP2007/072546 (3 PP.).

Form PCT/ISA/220, mailed Jan. 15, 2008, in corresponding PCT Application No. PCT/JP2007/072546 (4 PP.).

Form PCT/ISA/237, mailed Jan. 15, 2008, in corresponding PCT Application No. PCT/JP2007/072546 (3 PP.).

Japanese Office Action mailed Nov. 29, 2011 issued in corresponding corresponding Japanese Patent Application No. 2009-542438.

* cited by examiner

FIG. 8

VIA RADIUS: 75 um
PLATING THICKNESS: 35um

|              | θ [deg] 45 | 90    | 135   | 180   |
|--------------|-------|-------|-------|-------|
| CLEARANCE 100 | 54.19 | 42.77 | 35.52 | 31.40 |
| [um] 120     | 57.97 | 46.40 | 38.96 | 34.69 |
| 140          | 61.25 | 49.58 | 41.99 | 37.63 |
| 160          | 64.16 | 52.41 | 44.72 | 40.27 |
| 180          | 66.78 | 54.96 | 47.20 | 42.69 |
| 200          | 69.15 | 57.30 | 49.46 | 44.91 |
| 220          | 71.33 | 59.44 | 51.56 | 46.97 |
| 240          | 73.35 | 61.43 | 53.50 | 48.88 |
| 260          | 75.22 | 63.28 | 55.32 | 50.67 |
| 280          | 76.97 | 65.01 | 57.03 | 52.36 |
| 300          | 78.62 | 66.64 | 58.64 | 53.95 |

FIG. 9

VIA RADIUS: 100 um
PLATING THICKNESS: 35um

|              | θ [deg] 45 | 90    | 135   | 180   |
|--------------|-------|-------|-------|-------|
| CLEARANCE 100 | 50.10 | 38.04 | 30.77 | 26.75 |
| [um] 120     | 53.80 | 41.49 | 33.95 | 29.75 |
| 140          | 57.01 | 44.52 | 36.78 | 32.44 |
| 160          | 59.84 | 47.23 | 39.33 | 34.88 |
| 180          | 62.39 | 49.67 | 41.65 | 37.11 |
| 200          | 64.70 | 51.90 | 43.78 | 39.18 |
| 220          | 66.82 | 53.96 | 45.76 | 41.10 |
| 240          | 68.77 | 55.87 | 47.60 | 42.89 |
| 260          | 70.59 | 57.65 | 49.33 | 44.58 |
| 280          | 72.30 | 59.31 | 50.95 | 46.17 |
| 300          | 73.90 | 60.89 | 52.48 | 47.67 |

FIG. 1 0

VIA RADIUS: 75 um
PLATING THICKNESS: 35 um

|  | θ [deg] | | |
|---|---|---|---|
|  | 45 | 90 | 135 |
| CLEARANCE 100 | 135.33 | 112.40 | 100.73 |
| 120 | 147.98 | 124.87 | 113.10 |
| 140 | 159.30 | 136.09 | 124.26 |
| 160 | 169.57 | 146.29 | 134.42 |
| 180 | 178.96 | 155.65 | 143.76 |
| 200 | 187.64 | 164.29 | 152.38 |
| 220 | 195.69 | 172.32 | 160.41 |
| 240 | 203.20 | 179.83 | 167.90 |
| 260 | 210.25 | 186.87 | 174.93 |
| 280 | 216.89 | 193.50 | 181.56 |
| 300 | 223.16 | 199.76 | 187.82 |

FIG. 1 1

VIA RADIUS: 100 um
PLATING THICKNESS: 35 um

|  | θ [deg] | | |
|---|---|---|---|
|  | 45 | 90 | 135 |
| CLEARANCE 100 | 118.50 | 94.69 | 82.99 |
| 120 | 129.90 | 105.77 | 93.90 |
| 140 | 140.17 | 115.83 | 103.85 |
| 160 | 149.53 | 125.06 | 113.00 |
| 180 | 158.14 | 133.58 | 121.47 |
| 200 | 166.13 | 141.50 | 129.36 |
| 220 | 173.57 | 148.90 | 136.73 |
| 240 | 180.55 | 155.84 | 143.66 |
| 260 | 187.12 | 162.39 | 150.19 |
| 280 | 193.32 | 168.57 | 156.37 |
| 300 | 199.21 | 174.44 | 162.23 |

US 8,429,594 B2

VIA DESIGN APPARATUS AND VIA DESIGN METHOD BASED ON IMPEDANCE CALCULATIONS

CROSS-REFERENCE TO RELATED APPLICATIONS

This application is a continuation application, filed under 35 U.S.C. §111(a), of PCT Application No. PCT/JP2007/072546, filed on Nov. 21, 2007, the disclosure of which is herein incorporated in its entirety by reference.

FIELD

The embodiment discussed herein is related to a via design apparatus and a via design method.

BACKGROUND

When the layers of a multilayer printed board are connected with lines, holes are made on the printed board and the inner walls (side walls) of the holes are plated to create vias. The vias allow connections between the layers.

Incidentally, as a structure of printed board to achieve a higher density of wiring, there is a via division structure in which a via is divided and a plurality of wiring patterns are connected.

[Patent Document 1] Japanese Laid-open Patent Publication No. 08-123839
[Patent Document 2] Japanese Laid-open Patent Publication No. 2000-101241
[Patent Document 3] Japanese Laid-open Patent Publication No. 2000-216513

However, in the above via division structure, an impedance mismatch may occur on the transmission path due to the impedance of the via, causing the quality of signals to deteriorate.

SUMMARY

According to an aspect of the invention, a via design apparatus for designing a via providing connections between a plurality of layers inside a multilayer board is provided. The via design apparatus includes: a determination section that determines a value of a shape parameter indicating a shape of a via in the multilayer board, the via having a hole passing through the plurality of layers and a conductive section on a side wall of the hole; and a calculation section that calculates a value of impedance of the via according to the value of the shape parameter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a table illustrating a first example of the results of an impedance calculation process when the first simulation model according to the embodiment of the present invention is used;
FIG. 9 is a table illustrating a second example of the results of the impedance calculation process when the first simulation model of an embodiment of the present invention is used;
FIG. 10 is a table illustrating a first example of the results of the impedance calculation process when the second simulation model according to the embodiment of the present invention is used;
FIG. 11 is a table illustrating a second example of the results of the impedance calculation process when the second simulation model according to the embodiment of the present invention is used.

DESCRIPTION OF EMBODIMENT

Hereinafter, an embodiment of the present invention will be described with reference to the accompanying drawings.

The configuration of a via design apparatus according to the embodiment will be described.

Figure 1:
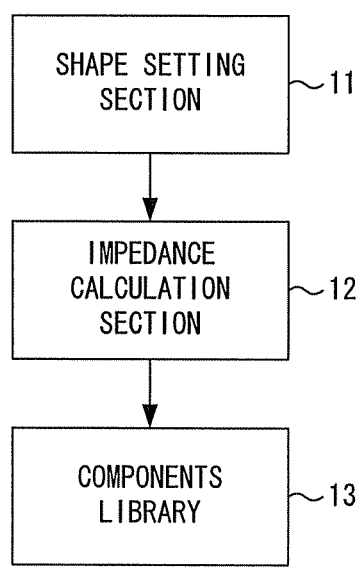
FIG. 1 is a block diagram illustrating an example of the configuration of a via design apparatus according to an embodiment of the present invention.

FIG. 1 is a block diagram illustrating an example of the configuration of the via design apparatus of the present embodiment. The via design apparatus includes a shape setting section 11, an impedance calculation section 12, and a components library 13. The via design apparatus is realized by a computer having a CPU (Central Processing Unit) and a storage device. The shape setting section 11 and the impedance calculation section 12 are represented by programs that are stored in the storage device and executed by the CPU. The components library 13 is stored in the storage device. Incidentally, a determination section for example includes the shape setting section 11. A calculation section for example includes the impedance calculation section 12. The components library 13 has information about components used for designing circuits and implementation.

Figure 2:
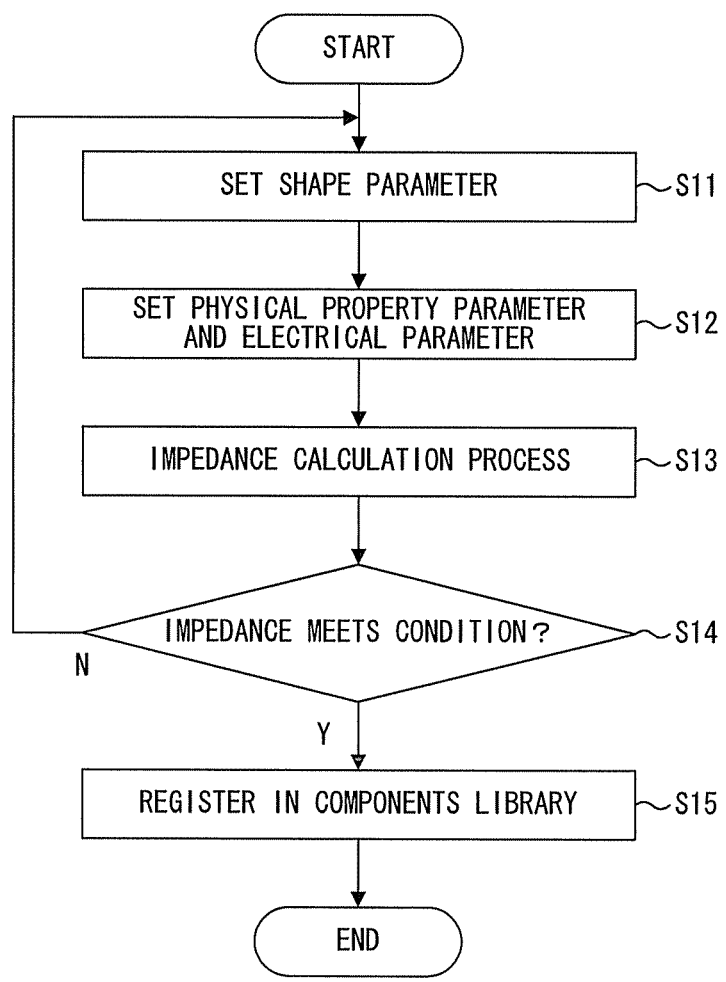
FIG. 2 is a flowchart illustrating an example of the operation of the via design apparatus according to the embodiment of the present invention.

FIG. 2 is a flowchart illustrating an example of the operation of the via design apparatus according to the present embodiment. The shape setting section 11 determines a shape parameter indicating the shape of a via in accordance with instructions from a user, and sets the shape parameter in a simulation model of the via (S11). The shape setting section 11 is for example realized by a three-dimensional CAD (Computer-Aided Design) system.

In accordance with instructions from the user, the impedance calculation section 12 then determines a physical property parameter indicating physical properties of materials of the via and an electrical parameter indicating the input and output of the via; and sets the physical property parameter and the electrical parameter in the simulation model of the via (S12). The electrical parameter here includes for example the output impedance of an output circuit connected to an input end of the via and the load impedance of a load connected to an output end of the via. Subsequently, the impedance calculation section 12 uses the simulation model to perform an impedance calculation process by which the impedance of the via is calculated (S13). The impedance here is characteristic impedance or differential impedance. The impedance calculation section 12 is for example realized by three-dimensional electromagnetic field analysis software such as HFSS (High-Frequency Structure Simulator). HFSS calculates the properties of a device represented by the simulation model by solving Maxwell's equations of electromagnetic field through numerical simulation.

The impedance calculation section 12 then makes a determination as to whether the calculated impedance meets a predetermined condition (S14). When the impedance does not meet the condition (S14, N), the impedance calculation section 12 returns to the process S11, determines as the shape parameter a value different from the preset value, and sets the shape parameter in the simulation model. When the condition is met (S14, Y), the impedance calculation section 12 registers in the components library 13 information about the via including parameters and impedance (S15) and the flow ends. The above predetermined condition for example is that a difference between the calculated impedance and desired impedance becomes less than a predetermined threshold. The predetermined condition is that the calculated impedance falls within a predetermined range. First and second conditions for example are the predetermined condition.

The following describes a via having a via division structure.

Figure 3:
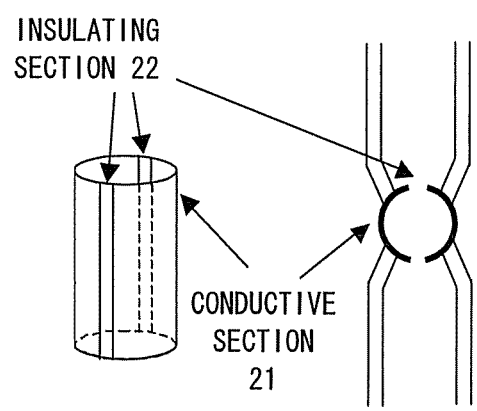
FIG. 3 is a structural diagram illustrating an example of a via division structure according to the embodiment of the present invention.

FIG. 3 is a structural diagram illustrating an example of the via division structure according to the present embodiment. The via division structure includes a conductive section 21 that provides connections between different signal layers; and an insulating section 22 that divides the conductive section 21. The conductive sections 21 divided by the insulating section 22 provide connections between the layers of wiring pattern. The via division structure has a hole passing through the plurality of the layers. The conductive sections 21 are provided on a side wall of the hole.

The following describes a simulation model of the via division structure.

A first simulation model that represents a via having one conductive section 21 will be described.

Figure 4:
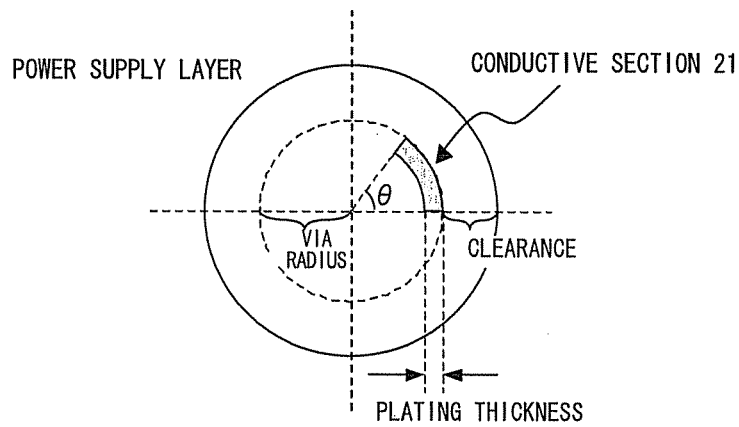
FIG. 4 is a plan view illustrating an example of a first simulation model according to an embodiment of the present invention.
Figure 5:
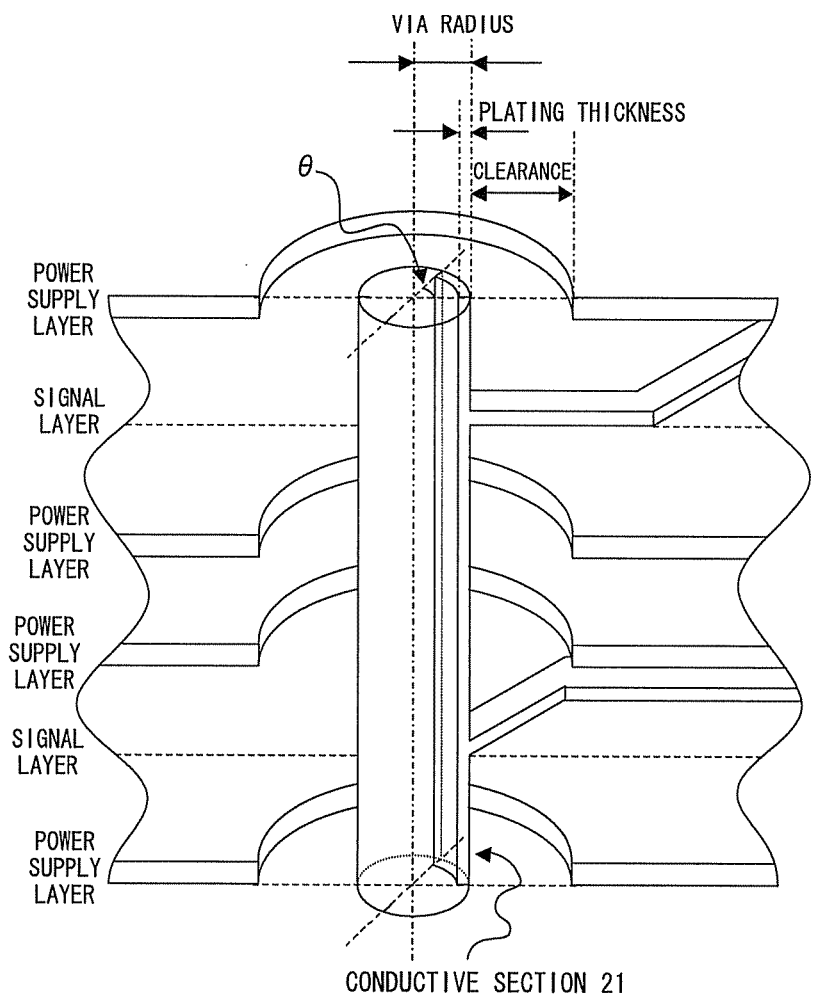
FIG. 5 is a perspective diagram illustrating an example of the first simulation model according to the embodiment of the present invention.

FIG. 4 is a plan view illustrating an example of the first simulation model according to the present embodiment. FIG. 5 is a perspective diagram illustrating an example of the first simulation model according to the present embodiment. The first simulation model is represented by the shape parameters indicating the shape: via radius r that is the radius of the outer circumference of the via; plating thickness t that is the thickness of plating of the via; central angle θ of the conductive section 21; and clearance d that is the shortest distance between a power supply layer and the via. In a six-layer printed board that is an example of the multilayer board illustrated in FIG. 5, power supply layers and signal layers are alternately arranged. The conductive section 21 provides a connection between signal lines on two different signal layers.

The following describes a second simulation model that represents a via having two conductive sections 21.

Figure 6:
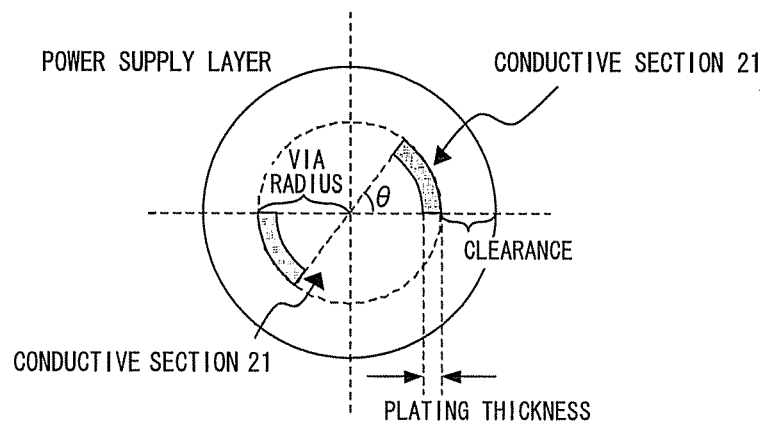
FIG. 6 is a plan view illustrating an example of a second simulation model according to the embodiment of the present invention.
Figure 7:
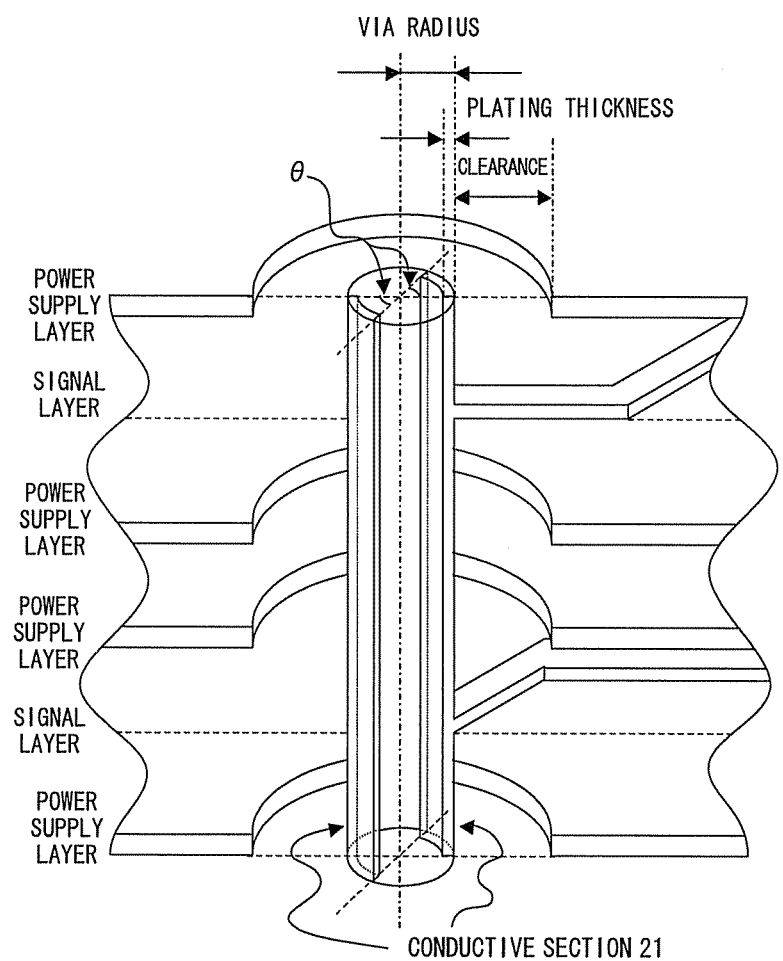
FIG. 7 is a perspective diagram illustrating an example of the second simulation model according to the embodiment of the present invention.

FIG. 6 is a plan view illustrating an example of the second simulation model according to the present embodiment. FIG. 7 is a perspective diagram illustrating an example of the second simulation model according to the present embodiment. The two conductive sections 21 of the second simulation model are each represented by similar shape parameters to those of the first simulation model.

The following describes the impedance calculation process.

The following describes the results of the impedance calculation process when the first simulation model is used.

When one conductive section 21 is used, the impedance calculation process calculates the characteristic impedance. The characteristic impedance is the impedance of a transmission line when the length of the transmission line is assumed to be infinite. By using the characteristic impedance, impedance matching is carried out to cause the following impedances to be equal to each other: the output impedance of an output circuit that outputs signals to the transmission line, the characteristic impedance of the transmission line, and the load impedance of a load connected to the end of the transmission line. Since the impedance-matched circuit is the equivalent of a transmission line along which uniform characteristic impedance is maintained infinitely, reflections of signals can be prevented.

FIG. 8 is a table illustrating a first example of the results of the impedance calculation process when the first simulation model of the present embodiment is used. FIG. 9 is a table illustrating a second example of the results of the impedance calculation process when the first simulation model of the present embodiment is used. The tables of FIGS. 8 and 9 illustrate the values of the characteristic impedance Z0 [Ω] calculated by the impedance calculation process with respect to central angle θ [deg] and clearance d [µm]. The first example is the results of the impedance calculation process when via radius r is 75 µm and plating thickness t is 35 µm. The second example is the results of the impedance calculation process when via radius r is 105 µm and plating thickness t is 35 µm.

According to the results of the impedance calculation process, a combination of θ and d can be determined so that the characteristic impedance Z0 of the via is brought closer to a desired value.

The following describes the results of the impedance calculation process when the second simulation model is used.

When two conductive sections 21 are used, the impedance calculation process calculates differential impedance. When there are two lines of conductive section, the differential impedance is characteristic impedance of the two lines of conductive section.

Incidentally, the impedance calculation section 12 may calculate a plurality of values of impedance in response to combinations of a plurality of values of shape parameter; select, out of a plurality of the calculated values of impedance, the value of impedance that is closest to the desired impedance and the value of shape parameter corresponding to the value of impedance; and output the values.

Moreover, the change of the shape parameter value by the shape setting section 11 and the calculation of the impedance by the impedance calculation section 12 may be repeated until the calculated impedance meets the above predetermined condition and the resultant shape parameter and impedance may be output.

FIG. 10 is a table illustrating a first example of the results of the impedance calculation process when the second simulation model of the present embodiment is used. FIG. 11 is a table illustrating a second example of the results of the impedance calculation process when the second simulation model of the present embodiment is used. The tables illustrate the values of the differential impedance Zdiff [Ω] calculated by the impedance calculation process with respect to central angle θ [deg] and clearance d [μm]. The first example is the results of the impedance calculation process when via radius r is 75 μm and plating thickness t is 35 μm. The second example is the results of the impedance calculation process when via radius r is 105 μm and plating thickness t is 35 μm.

According to the results of the impedance calculation process, a combination of θ and d can be determined so that the differential impedance Zdiff of the via is brought closer to a desired value.

The following describes a circuit design apparatus that uses the via design apparatus according to the present embodiment.

Figure 12:
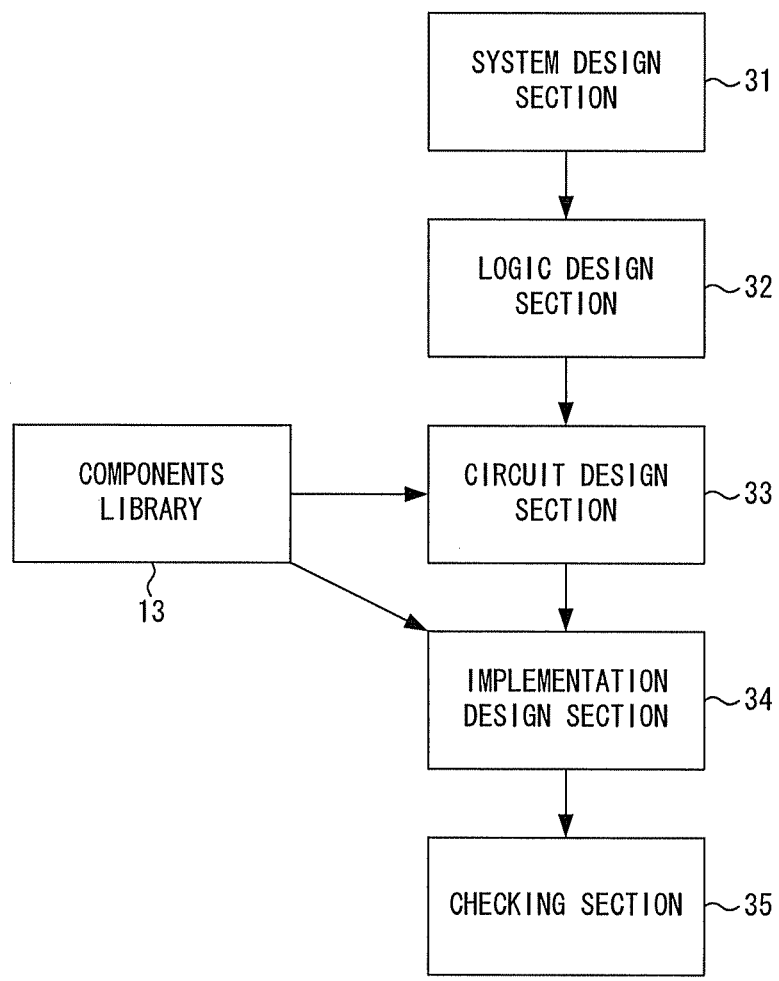
FIG. 12 is a block diagram illustrating an example of the configuration of the circuit design apparatus according to the embodiment of the present invention.

FIG. 12 is a block diagram illustrating an example of the configuration of the circuit design apparatus according to the present embodiment. The circuit design apparatus includes the above components library 13, a system design section 31, a logic design section 32, a circuit design section 33, an implementation design section 34, and a checking section 35. The components library 13 is shared with the via design apparatus. Components registered in the components library 13 include vias registered by the via design apparatus.

Figure 13:
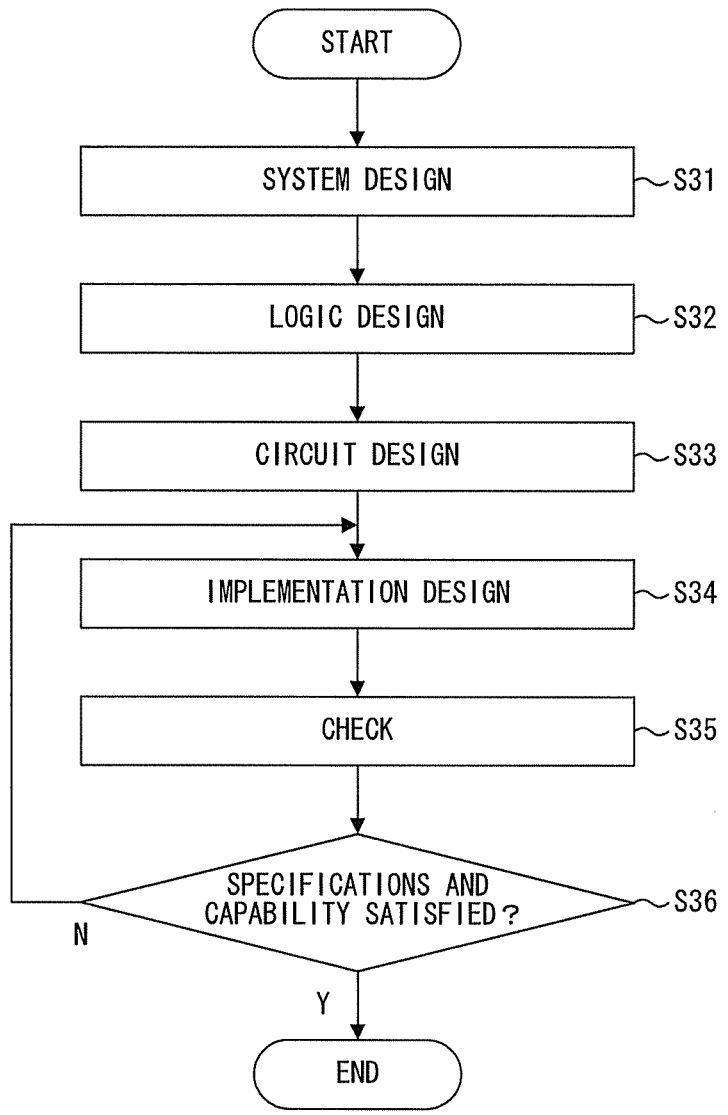
FIG. 13 is a flowchart illustrating an example of the operation of the circuit design apparatus according to the embodiment of the present invention.

FIG. 13 is a flowchart illustrating an example of the operation of the circuit design apparatus according to the present embodiment. Here, a device to be designed is referred to as a design-target device. First the system design section 31 carries out the system design of the design-target device and determines the capability and specifications of the design-target device (S31). The logic design section 32 then produces a logic circuit diagram on the basis of the capability and specifications (S32). The circuit design section 33 carries out the design of the circuit using the logic circuit diagram and components registered in the components library 13 and produces circuit design data (S33). Here, the circuit design section 33 matches impedance between the via and the circuit connected to the via.

First, the implementation design section 34 determines how components are arranged and connected using the circuit design data and components registered in the components library 13 and carries out the design of implementation by wiring lines to produce a wiring pattern (S34).

Subsequently, the checking section 35 carries out the circuit simulation of the produced wiring pattern, checks the wiring pattern, and conducts thermal analysis and the like for checking (S35). The checking section 35 then makes a determination as to whether the check results satisfy the specifications and the capability (S36). If the check results do not satisfy the specifications and the capability (S36, N), the checking section 35 returns to the process S34 to carry out the design of implementation again. When the check results satisfy the specifications and the capability (S36, Y), the flow ends.

The above circuit design apparatus can design circuits and multilayer boards using vias designed by the via design apparatus. Therefore, it is possible to control the impedance of a via and to match impedance between the via and the previous or subsequent component in designing a circuit.

According to the present embodiment, the control of impedance is possible in the via division structure.

Figure 14:
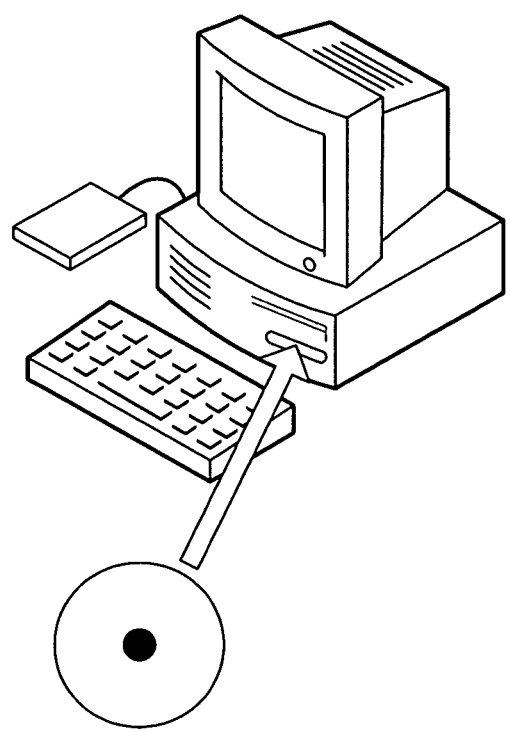
FIG. 14 is a diagram of a computer and a computer-readable recording medium storing a program.

Moreover, a via design program can be provided as a program for causing a computer that constitutes the via design apparatus to perform the above steps. Computer-readable recording media on which the above program is recorded allow the computer that constitutes the via design apparatus to execute the program (see FIG. 14). The computer-readable recording media include internal storage devices such as ROM and RAM that are installed inside computers; portable storage media such as CD-ROM, flexible disks, DVD disks, magnetic optical disks and IC cards; databases in which computer programs are stored; and other computers and databases of the computers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A via design apparatus for designing a via providing connections between a plurality of layers inside a multilayer board, the via design apparatus comprising:
   a determination section that determines a value of a shape parameter indicating a shape of a via in the multilayer board, the shape of the via having a hole passing through the plurality of layers and a conductive section on a side wall of the hole, the hole being a circular cylinder; and
   a calculation section that calculates a value of impedance of the via according to the value of the shape parameter which includes a radius of the circular cylinder and a central angle of the conductive section.

2. The via design apparatus according to claim 1, wherein the value of the shape parameter further includes one of a thickness of the conductive section, and a shortest distance from at least one power supply layer out of the plurality of layers.

3. The via design apparatus according to claim 1, wherein the impedance is characteristic impedance of the conductive section.

4. The via design apparatus according to claim 1, wherein the shape of the via has an additional conductive section on the side wall, and the impedance is differential impedance of the conductive section and the additional conductive section.

5. The via design apparatus according to claim 1, wherein:
   the determination section determines a plurality of values of the shape parameter; and
   the calculation section calculates a plurality of values of the impedance from the plurality of values of the shape parameter respectively, and selects a value that meets a predetermined first condition as the value of impedance from the plurality of values of the impedance.

6. The via design apparatus according to claim 1, wherein when the value of impedance does not fall within the range determined as a predetermined second condition, the determination section changes the value of the shape parameter that meets the predetermined second condition and the calculation section calculates the value of impedance from the changed value of the shape parameter.

7. The via design apparatus according to claim 1, wherein the calculation section determines a physical property parameter indicating physical properties of materials of the via and an electrical parameter indicating the input and output of the via and calculates the value of impedance of the via according to the value of the shape parameter, the physical property parameter and the electrical parameter.

8. The via design apparatus according to claim 1, wherein the calculation section calculates the value of impedance of the via by a three-dimensional electromagnetic field analysis simulation.

9. The via design apparatus according to claim 1, wherein the determination section determines the shape of the via in a simulation by a three-dimensional computer-aided design (CAD) system.

10. Non-transitory computer-readable recording medium storing a via design program that allows a computer to execute a process for calculating a value regarding a design of a via that provides connections between a plurality of layers inside a multilayer board, the process comprising:
   determining a value of a shape parameter indicating a shape of a via in the multilayer board, the shape of the via having a hole passing through the plurality of layers and a conductive section on a side wall of the hole, the hole being a circular cylinder; and
   calculating a value of impedance of the via according to the value of the shape parameter which includes a radius of the circular cylinder and a central angle of the conductive section.

11. The non-transitory computer-readable recording medium according to claim 10, wherein the value of the shape parameter further includes one of a thickness of the conductive section, and a shortest distance from at least one power supply layer out of the plurality of layers.

12. The non-transitory computer-readable recording medium according to claim 10, wherein the impedance is characteristic impedance of the conductive section.

13. The non-transitory computer-readable recording medium according to claim 10, wherein the shape of the via has an additional conductive section on the side wall, and the impedance is differential impedance of the conductive section and the additional conductive section.

14. The non-transitory computer-readable recording medium according to claim 10, wherein:
   the determining determines a plurality of values of the shape parameter; and
   the calculating calculates a plurality of values of the impedance from the plurality of the values of the shape parameter respectively, and selects a value that meets a predetermined first condition as the value of impedance from the plurality of the values of the impedance.

15. The non-transitory computer-readable recording medium according to claim 10, wherein when the value of the impedance does not fall within the range determined as a predetermined second condition, the determining changes the value of the shape parameter that meets the predetermined second condition and the calculating calculates the value of impedance from the changed value of the shape parameter.

16. The non-transitory computer-readable recording medium according to claim 10, wherein the calculating determines a physical property parameter indicating physical properties of materials of the via and an electrical parameter indicating the input and output of the via and calculates the value of impedance of the via according to the value of the shape parameter, the physical property parameter and the electrical parameter.

17. The non-transitory computer-readable recording medium according to claim 10, wherein the calculating calculates the value of impedance of the via by a three-dimensional electromagnetic field analysis simulation.

18. A via design method for designing a via providing connections between a plurality of layers inside a multilayer board, the via design method comprising:
   determining, by using a computer, a value of a shape parameter indicating a shape of a via in the multilayer board, the shape of the via having a hole passing through the plurality of layers and a conductive section on a side wall of the hole, the hole being a circular cylinder; and
   calculating, by using the computer, a value of impedance of the via according to the value of the shape parameter which includes a radius of the circular cylinder and a central angle of the conductive section.

* * * * *